United States Patent
Johnson

(10) Patent No.: US 10,470,329 B2
(45) Date of Patent: Nov. 5, 2019

(54) MULTI-COMPARTMENT ARC-GENERATING ELECTRICAL EQUIPMENT USING COMPRESSIBLE INTERCOMPARTMENT CABLE SEALS

(71) Applicant: Eaton Intelligent Power Limited, Dublin (IE)

(72) Inventor: Wesley Byron Johnson, Fletcher, NC (US)

(73) Assignee: Eaton Intelligent Power Limited (IE)

( * ) Notice: Subject to any disclaimer, the term of this patent is extended or adjusted under 35 U.S.C. 154(b) by 0 days.

(21) Appl. No.: 15/419,736

(22) Filed: Jan. 30, 2017

(65) Prior Publication Data
US 2017/0223850 A1  Aug. 3, 2017

Related U.S. Application Data

(60) Provisional application No. 62/288,610, filed on Jan. 29, 2016.

(51) Int. Cl.
| | | |
|---|---|---|
| *H05K 7/00* | (2006.01) | |
| *H05K 7/14* | (2006.01) | |
| *H02B 13/00* | (2006.01) | |
| *H02B 1/30* | (2006.01) | |

(52) U.S. Cl.
CPC ........ *H05K 7/1432* (2013.01); *H02B 13/005* (2013.01); *H02B 1/308* (2013.01)

(58) Field of Classification Search
None
See application file for complete search history.

(56) References Cited

U.S. PATENT DOCUMENTS

| | | | | |
|---|---|---|---|---|
| 3,830,954 A | * | 8/1974 | Caudill | H02B 1/305 |
| | | | | 174/362 |
| 6,512,669 B1 | * | 1/2003 | Goodwin | H02B 1/28 |
| | | | | 200/50.12 |
| 7,561,412 B2 | * | 7/2009 | Brandt | H02B 13/025 |
| | | | | 361/616 |
| 2004/0195944 A1 | * | 10/2004 | Sugihara | H05K 7/1495 |
| | | | | 312/283 |
| 2005/0259383 A1 | * | 11/2005 | Ewing | H02B 1/306 |
| | | | | 361/622 |
| 2009/0200273 A1 | * | 8/2009 | Josten | H02B 13/025 |
| | | | | 218/157 |
| 2012/0097413 A1 | * | 4/2012 | Bugaris | H02B 13/025 |
| | | | | 174/50 |

* cited by examiner

*Primary Examiner* — Courtney L Smith
*Assistant Examiner* — Rashen E Morrison
(74) *Attorney, Agent, or Firm* — Stanek Lemon Crouse & Meeks, P.A.

(57) ABSTRACT

An apparatus includes an enclosure comprising first and second abutting compartment and at least one cable passing between the first and second compartments through a sealing multi-cable transit mounted in a wall shared by the first and second compartments. The first compartment may contain arc-generating equipment and the second compartment may contain equipment vulnerable to arc damage. The first compartment may include a medium-voltage cubicle and the second compartment may include a low-voltage control cubicle.

12 Claims, 3 Drawing Sheets

MULTI-COMPARTMENT ARC-GENERATING ELECTRICAL EQUIPMENT USING COMPRESSIBLE INTERCOMPARTMENT CABLE SEALS

CROSS-REFERENCE TO RELATED APPLICATION

This application claims priority to U.S. Provisional Application No. 62/288,610, filed Jan. 29, 2016, the contents of which are hereby incorporated herein by reference in its entirety.

BACKGROUND

Medium voltage electrical equipment, such as adjustable frequency drives, typically includes circuitry that operates at relatively high voltages (e.g., multiple kV) that can pose a risk of high-energy arcs. Such arcs may generate gasses, flame, pressure and debris, which may damage vulnerable circuitry, such as control circuitry. While arc-generating and arc-vulnerable circuitry may be housed within respective compartments (e.g., cubicles) of an equipment enclosure, gasses, flame, pressure and debris produced by an arc in one compartment can enter adjacent compartments.

It can be particularly challenging to seal between compartments particularly in areas where cables enter/exit/pass between the compartments. For an arc resistant enclosure to achieve a 2B rating, it must be able to withstand an arc without allowing gasses to enter the control cubicle. The control cubicle often contains many wires and cables that enter and exit the cubicle. If the cable passageway is not sealed, gasses could potentially breach the cubicle. Conventional methods of sealing, such as using silicone RTV, may be undesirable as a manufacturing process because it may be difficult to obtain a positive seal around cable bundles and because results may vary from one installer to another. In addition, movement of cables (particularly when placed across a hinge) can pull at the silicone and break the seal.

SUMMARY OF THE INVENTION

According to some embodiments, an apparatus includes an enclosure comprising first and second abutting compartment and at least one cable passing between the first and second compartments through a sealing multi-cable transit mounted in a wall shared by the first and second compartments. The first compartment may contain arc-generating equipment and the second compartment may contain equipment vulnerable to arc damage. The first compartment may include a medium-voltage cubicle and the second compartment may include a low-voltage control cubicle.

DETAILED DESCRIPTION

Figure 1A:
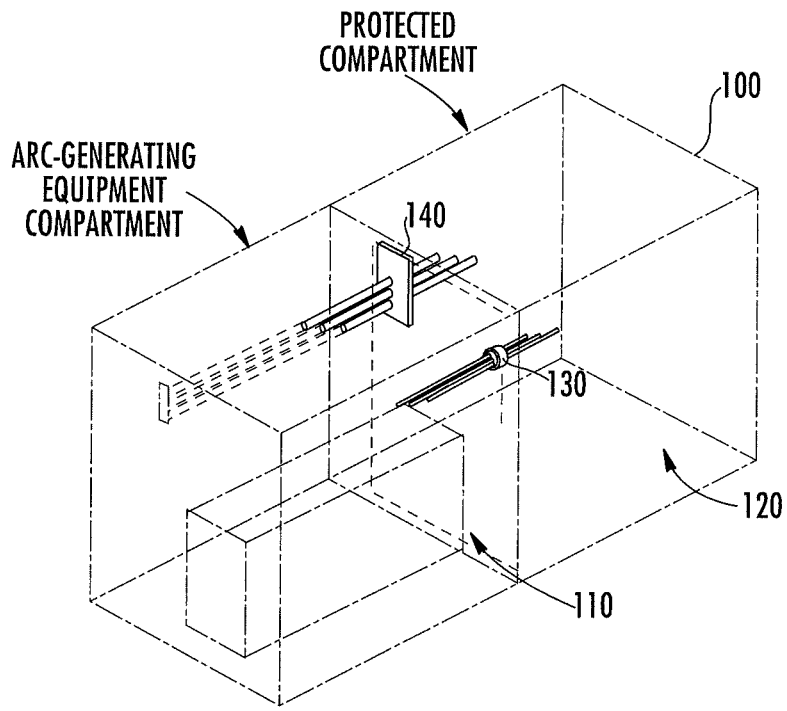
FIGS. 1A and 1B illustrate a multiple compartment enclosure with intercompartment seals according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

According to some embodiments of the inventive subject matter, a flexible Multi Cable Transit (MCT) can be used to provide sealed cable paths between compartments of an enclosure to reduce or prevent the spread of arc gasses and pressures between compartments. Commercially available MCTs typically combine a mounting frame with a module insert. The MCT may include a compression plate or ring that compresses the module insert around a cable to provide a seal. An MCT may be used to provide a cable seal between a control compartment and a compartment housing equipment capable of generating arcs. An MCT can also be applied between structures when integrating equipment already containing arc ratings with equipment that does not have an arc rating. The integration may require cable pass-through between equipment, and using an MCT to seal these pass-throughs may allow the certified equipment to retain its rating without the need to retest.

Figure 1B:
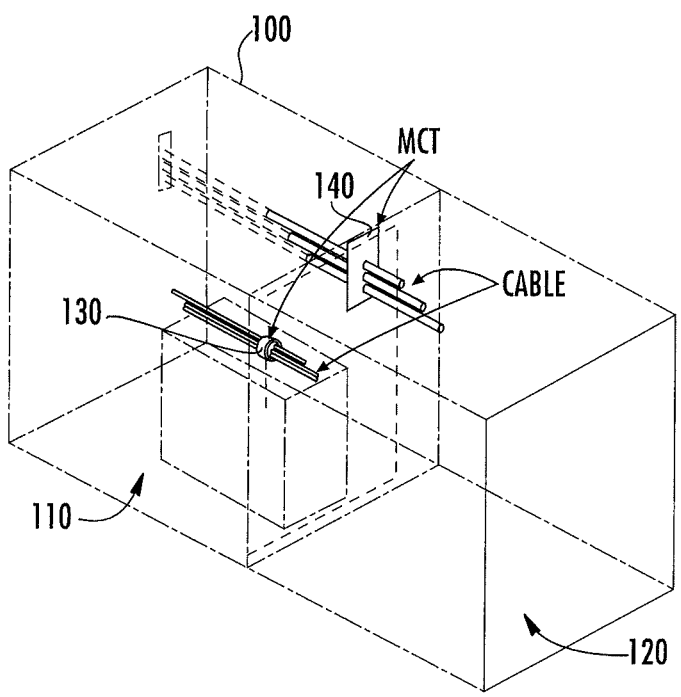
Figure 2:
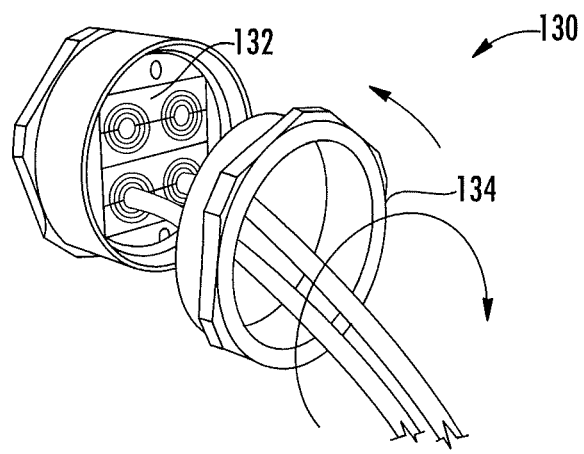
FIG. 2 illustrates an intercompartment seal according to some embodiments.
Figure 3:
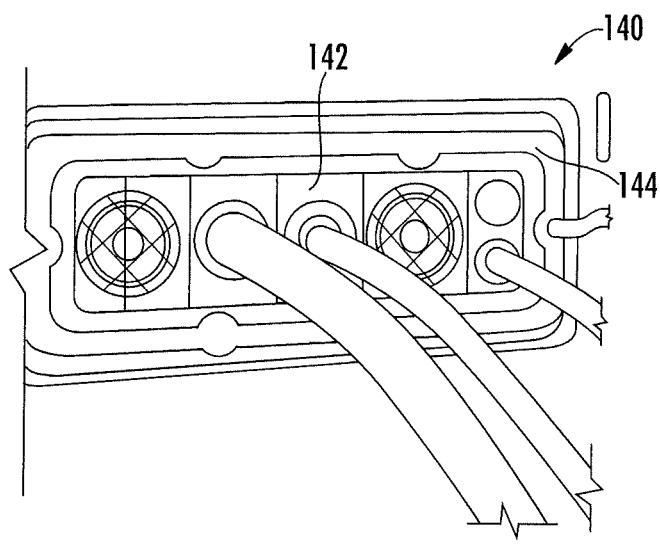
FIG. 3 illustrates an intercompartment seal according to further embodiments.

FIGS. 1A and 1B illustrate an enclosure 100 according to some embodiments. The enclosure 100 includes a first compartment 110 that is configured to house arc-generating equipment. A second compartment 120 is configured to house equipment that may be damaged by gasses, flame, and pressure produced by an arc in the first compartment 110. First and second MCTs 130, 140 are provided in a wall shared by the compartments 110, 120 to seal cables passing between the first and second compartments 110, 120. The first and second MCTs 130, 140 may be, for example, Roxtec RG M63 cable glands and Roxtec CF16 compact seals distributed by Roxtec International AB. Referring to FIG. 2, the MCT 130 may include user configurable compression modules 132 having removable concentric rings that may be selectively removed to provide a tailored fit around a cable. The compression modules 132 are configured to be compressed by a compression screw ring 134 to provide a seal where the cable passes through a compartment wall. Referring to FIG. 3, the MCT 140 may have rectangular shape and include similar compressible modules 142 that are compressed using a frame 144. The MCTs 130, 140 utilize compressible seals to prevent passage of flame and gasses between the compartments 110, 120.

Figure 4:
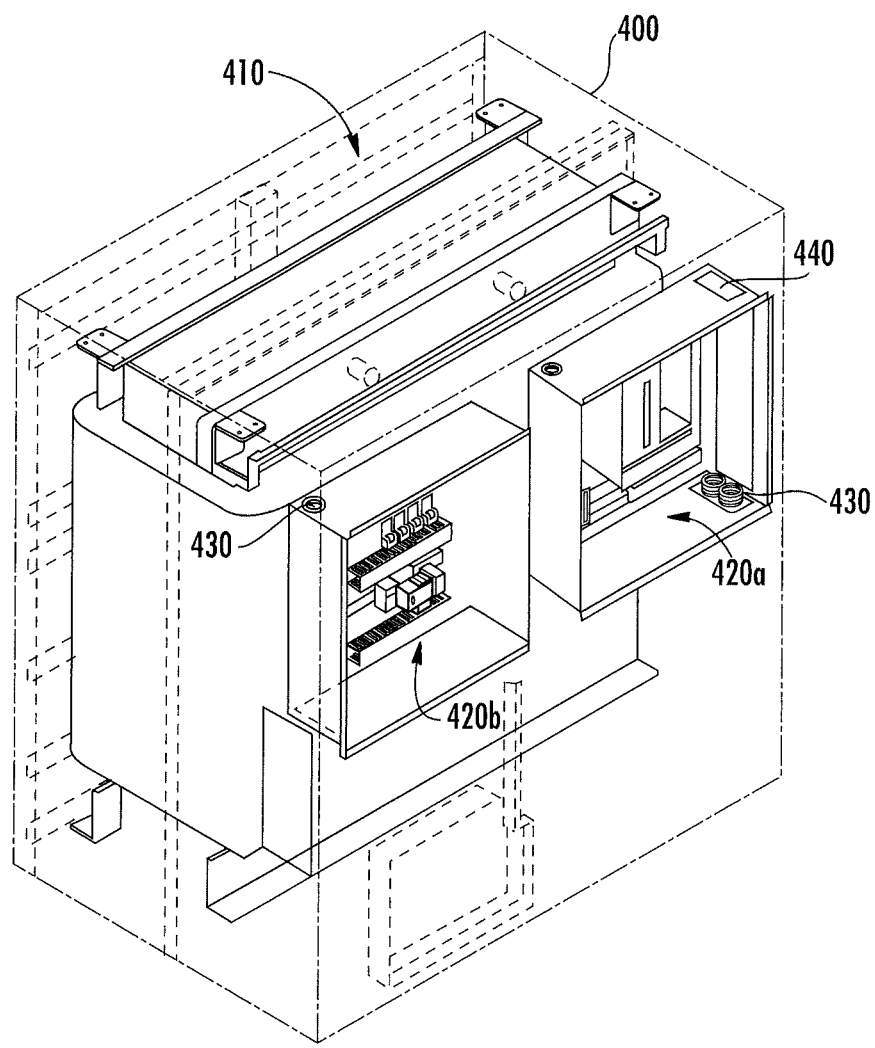
FIG. 4 illustrates a multiple compartment enclosure with intercompartment seals according to further embodiments

FIG. 4 illustrates an example application in medium voltage equipment. A device includes a medium-voltage compartment or cubicle 410 housing equipment that operates at voltages that may generate arcs. Low-voltage control cubicles 420*a*, 420*b* have MCTs 430, 440 mounted in wall shared with the medium-voltage cubicle 410 to provide sealed entrance/exit points for cables passing between the medium-voltage cubicle 410 and the control cubicles 420*a*, 420*b*. The MCTs 430, 440 may reduce or prevent passage of flame, gas and debris into the control cubicles 420*a*, 420*b*.

In this specification, there have been disclosed embodiments of the inventive subject matter and, although specific terms are employed, they are used in a generic and descriptive sense only and not for purposes of limitation. The following claims are provided to ensure that the present application meets all statutory requirements as a priority application in all jurisdictions and shall not be construed as limiting the scope of the inventive subject matter.

What is claimed:

1. An apparatus comprising:
   an enclosure comprising first and second abutting compartments, wherein the first compartment contains arc-generating medium-voltage equipment of an adjustable frequency drive and wherein the second compartment contains control circuitry of the adjustable frequency drive that is vulnerable to arc damage; and
   at least one cable passing between the first and second compartments through a sealing multi-cable transit (MCT) mounted in a wall between the first and second compartments and configured to inhibit transmission of arc gases from the first compartment to the second compartment.

2. The apparatus of claim 1, wherein the arc-generating medium-voltage equipment contained by the first compartment has an arc rating and wherein the control circuitry contained by the second compartment does not have an arc rating.

3. The apparatus of claim 1, wherein the at least one cable comprises a plurality of cables.

4. The apparatus of claim 3, wherein the MCT comprises a plurality of compression modules for respective ones of the plurality of cables and a frame configured to compress the plurality of compression modules to provide a seal where the plurality of cables passes through the wall.

5. An apparatus comprising: an enclosure comprising first and second abutting compartments; arc-generating equipment of an adjustable frequency drive disposed in the first compartment; the adjustable frequency drive comprising control circuitry that is vulnerable to arc damage is disposed in the second compartment; and a plurality of cables passing between the first and second compartments through a sealing MCT mounted in a wall between the first and second compartments and configured to inhibit transmission of arc gases from the first compartment to the second compartment.

6. The apparatus of claim 5, wherein the arc-generating equipment is medium-voltage equipment.

7. The apparatus of claim 5, wherein the MCT comprises a plurality of compression modules for respective one of the plurality of cables and a frame configured to compress the plurality of compression modules to provide a seal where the plurality of cables passes through the wall.

8. A method comprising:
   disposing first equipment and second equipment of an adjustable frequency drive in respective ones of abutting first and second compartments of an enclosure, wherein the first equipment is arc-generating equipment and wherein the second equipment is vulnerable to arc damage; and
   sealing at least one cable passing between the first and second equipment using an MCT mounted in a wall between the first and second compartments and configured to inhibit transmission of arc gases from the first compartment to the second compartment.

9. The method of claim 8, wherein the first equipment comprises medium-voltage equipment and wherein the second equipment comprises control circuitry.

10. The method of claim 8, wherein the first equipment comprises equipment having an arc rating and wherein the second equipment comprises equipment that does not have an arc rating.

11. The method of claim 8, wherein the at least one cable comprises a plurality of cables.

12. The method of claim 11, wherein the MCT comprises a plurality of compression modules for respective ones of the plurality of cables and a frame configured to compress the plurality of compression modules to provide a seal where the plurality of cables passes through the wall.

* * * * *